United States Patent
Deane et al.

[11] Patent Number: 6,064,091
[45] Date of Patent: May 16, 2000

[54] THIN FILM TRANSISTORS HAVING AN ACTIVE REGION COMPOSED OF INTRINSIC AND AMORPHOUS SEMICONDUCTING LAYERS

[75] Inventors: Steven C. Deane, Redhill; John M. Shannon, Whyteleafe, both of United Kingdom

[73] Assignee: U.S. Philips Corporation, New York, N.Y.

[21] Appl. No.: 09/209,085

[22] Filed: Dec. 10, 1998

[30]    Foreign Application Priority Data

Dec. 10, 1997 [GB]  United Kingdom ............... 9726094

[51] Int. Cl.[7] ................................. H01L 29/161
[52] U.S. Cl. ........................... 257/347; 257/52; 257/55; 257/57; 257/66; 257/348; 257/349; 257/350; 257/351
[58] Field of Search .......................... 257/331–344, 257/347–351, 52, 55, 57, 66

[56]              References Cited

U.S. PATENT DOCUMENTS

| 4,341,569 | 7/1982 | Yaron et al. ........................ 438/164 |
| 4,509,990 | 4/1985 | Vasudev ............................. 438/155 |
| 4,617,066 | 10/1986 | Vasudev ............................ 438/515 |
| 4,766,482 | 8/1988 | Smeltzer et al. ................... 257/660 |
| 4,797,721 | 1/1989 | Hsu ................................... 257/354 |
| 5,130,829 | 7/1992 | Shannon ............................ 359/59 |
| 5,155,571 | 10/1992 | Wang et al. ...................... 257/370 |
| 5,323,040 | 6/1994 | Baliga ............................... 257/332 |
| 5,587,591 | 12/1996 | Kingsley et al. .................. 257/292 |

FOREIGN PATENT DOCUMENTS

| 0276340B1 | 8/1988 | European Pat. Off. ........ G02F 1/133 |
| 0217406B1 | 6/1992 | European Pat. Off. ........ H01L 29/78 |

OTHER PUBLICATIONS

"Full–Color Fluorescent Display Devices Using a Near–UV Light–Emitting Diode" by Yuchi Sato, Nobuyuki Takahashi and Susumu Sato, Jpn. J. Appl. Phys. vol. 35 (1996), pp. L838–839.

*Primary Examiner*—Fetsum Abraham
*Attorney, Agent, or Firm*—John C. Fox

[57]              ABSTRACT

A thin film transistor (10) in an electronic device such as an active matrix display panel having an intrinsic amorphous silicon semiconductor layer (22) providing a channel region (23) between source and drain electrodes (14, 16) includes directly adjacent to the side of the semiconductor layer (22) remote from the gate electrode (25) at the channel region (23) a layer (20) of amorphous semiconductor material which has a high defect density and low conductivity that serves to provide recombination centres for photogenerated carriers. Leakage problems due to the photoconductive properties of the intrinsic semiconductor material are then reduced. Conveniently, an hydrogenated silicon rich amorphous silicon alloy (e.g. nitride etc) can be used for the recombination centre layer (20).

11 Claims, 3 Drawing Sheets

THIN FILM TRANSISTORS HAVING AN ACTIVE REGION COMPOSED OF INTRINSIC AND AMORPHOUS SEMICONDUCTING LAYERS

BACKGROUND OF THE INVENTION

This invention relates to an electronic device comprising a thin film transistor carried on a transparent, insulating, substrate and having spaced source and drain electrodes, an intrinsic amorphous silicon semiconductor layer extending between the source and drain for providing a channel region between the source and drain electrodes, and a gate insulator layer and gate electrode extending adjacent to the intrinsic semiconductor layer. The electronic device may be a flat panel display device, for example an active matrix liquid crystal display panel, or another type of large area electronic device such as a large area image sensor, a touch sensor or a thin film memory device.

There is presently considerable interest in developing thin film circuits comprising thin film transistors, hereinafter referred to as TFTs, on glass and other insulating substrates for large area electronics applications. The TFTs may form switching devices in an active matrix address array of elements, for example liquid crystal display elements and/or integrated drive circuits for such element matrices.

Examples of an active matrix liquid crystal display device using top gate amorphous silicon TFTs as switching devices for the display elements are described in EP-B-0217 406. In these devices, crossing sets of row and column address conductors are provided on a glass substrate together with a display element electrode adjacent each intersection between the row and column conductors which define a row and column array of display elements. Each display element electrode is connected to its associated row and column conductors via a top gate TFT also carried on the substrate. The amorphous silicon material forming the semiconductor channel region extending between the source and drain electrodes across an intervening part of the substrate surface has photoconductive properties and light for example from a backlight used to illuminate the display device through the substrate carrying the TFTs and incident on the channel region causes photocurrents due to light absorption in the amorphous silicon material. The resulting leakage currents can seriously affect the "off" state resistance of the TFT leading to significant charge leakage from the display element and degrading the quality of the display output. In order to reduce these effects, the channel region of each of the TFTs of the display device can be protected by an opaque light shield provided on the glass substrate and underlying the channel region, as described in the aforementioned specification, which serves to prevent light directed through the substrate towards the TFT from a backlight from reaching the channel region of the semiconductor layer. The light shields are provided as discrete islands of metal formed by patterning photolithographically a metal layer deposited over the substrate surface prior to forming the TFT structures. The light shields, and the intervening surface regions of the glass substrate, are covered by a protective insulating layer of, for example, silicon dioxide, that provides a planar surface on which the TFTs, address lines and display element electrodes are then formed, with the semiconductor layer of the TFTs then extending directly over the surface of this protective layer between the source and drain electrodes so as to be spaced, and insulated, from the underlying metal light shields. While the light shields adequately protect the semiconductor layers of the TFTs from exposure to illuminating light, their provision, and the provision of the necessary overlying layer of insulating material requires an additional photomask operation and two deposition steps in the fabrication process. Also, such metal light shields may cause unwanted parasitic capacitance effects.

OBJECT AND SUMMARY OF THE INVENTION

It is one object of the present invention to provide an improved electronic device comprising a TFT which is protected from undesirable photocurrent leakage effects in a simple manner.

According to the present invention there is provided an electronic device of the kind described in the opening paragraph which is characterised in that the channel region of the intrinsic semiconductor layer of the TFT at its side remote from the gate electrode extends directly adjacent to a layer of amorphous semiconductor material having a high defect density and low conductivity and which serves to provide recombination centres for photogenerated carriers.

The provision of a high defect density amorphous semiconductor material adjacent the intrinsic semiconductor layer at the channel region removes the need to provide a light shield. The layer acts as a recombination centre provider at the back of the channel region, that is at the side of the channel region remote from the gate, so that any excess carriers such as holes and electrons generated by light incident on the semiconductor layer are quickly recombined and leakage caused by photocurrents are consequently significantly reduced. Thus the need to provide a light shield and spacing insulator as in the known device is removed. The low conductivity of the layer ensures that no significant current can flow between the source and drain electrodes through this layer.

To perform this function effectively, the material of the amorphous semiconductor layer adjacent to the channel region desirably has a band gap which is approximately the same as that of the intrinsic amorphous silicon material, without making it too conductive, so that excess carriers in the intrinsic semiconductor layer can move into this layer relatively easily. The amorphous semiconductor material having high defect density preferably comprises a silicon rich amorphous silicon alloy material such as silicon rich amorphous silicon nitride, silicon carbide, silicon oxide or silicon oxynitride. An amorphous silicon rich silicon germanium alloy, whose band gap is slightly narrower than that of the intrinsic amorphous silicon, may also be used. Such non-stoichiometric silicon alloy materials can easily be employed using the same kind of fabrication process as used, for example, for providing the intrinsic amorphous silicon semiconductor layer and are entirely compatible. Such materials provide silicon dangling bond defects which serve as recombination centres and can readily be formed with the desired band gap value. For example, a silicon rich amorphous silicon nitride layer can have a band gap of around 2.0 eV compound with 1.8 eV for intrinsic amorphous silicon.

The invention is particularly beneficial in a flat panel active matrix display device, for example a liquid crystal display device, in which an array of the thin film transistors is carried on a common substrate with the thin film transistors being connected to sets of address conductors also carried on the substrate. The high defect density amorphous semiconductor material for the TFTs may be conveniently provided by patterning a layer of the material deposited over the substrate surface so as to leave a portion at the region of each TFT. The invention can also be used to advantage however in other devices in which photoconductive leakage in TFTs is likely to be a problem, for example image sensing arrays.

BRIEF DESCRIPTION OF THE DRAWING

Embodiments of electronic devices in accordance with the present invention will now be described, by way of example, with reference to the accompanying schematic drawings, in which.

DESCRIPTION OF THE PREFERRED EMBODIMENTS

Figure 1:
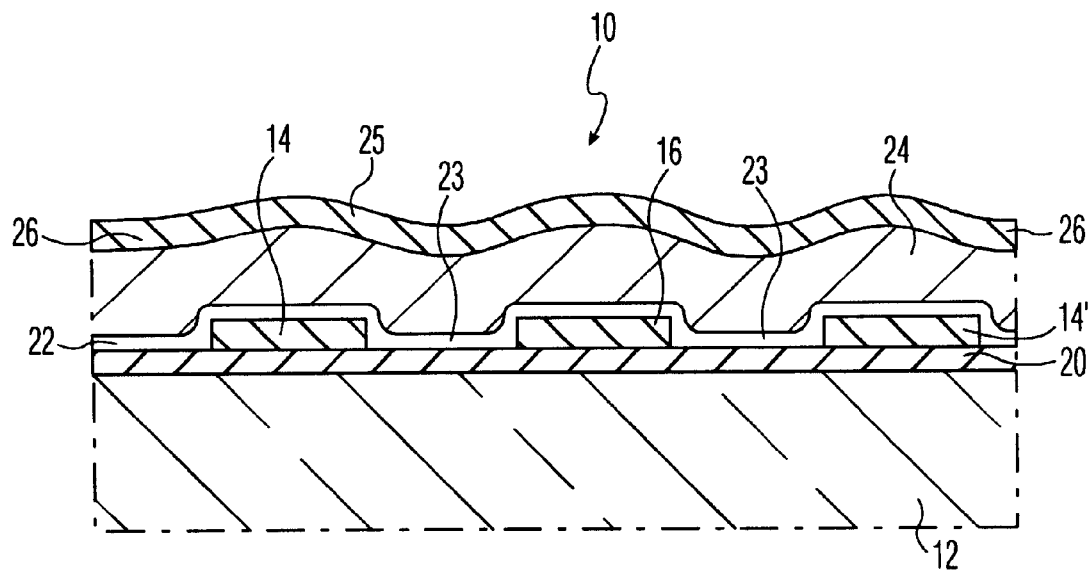
FIG. 1 is a cross-sectional view of a TFT in part of an electronic device in accordance with the present invention.

It should be noted that FIGS. 1, 2, 4, 5 and 6 are merely schematic and are not drawn to scale. Certain dimensions, such as the thickness of layers or regions, may be shown exaggerated while other dimensions may have been reduced for the sake of clarity. The same reference numerals are used throughout the drawings to indicate the same or similar parts.

Referring to FIG. 1, there is shown part of an electronic device, in this case an active matrix liquid crystal display device, comprising a TFT, generally referenced at 10, carried on an electrically insulating substrate 12 of glass, although other suitable insulating substrate materials, for example polymer materials, or substrates having an insulating surface, may be used instead. The TFT 10 is fabricated on the planar surface of the substrate 12 using conventional thin film processing techniques involving the deposition and patterning of various layers.

Figure 2:
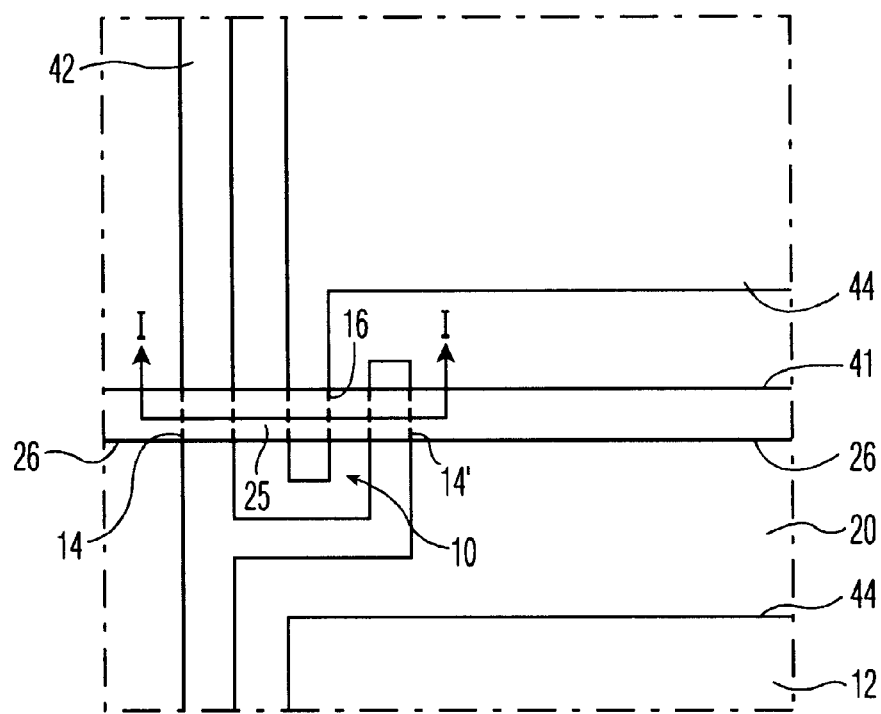
FIG. 2 is a plan view of part of an embodiment of an electronic device in accordance with the invention including the TFT and associated circuit elements, and comprising an active matrix display device.

The TFT 10 is of the so-called top-gate staggered kind with the gate electrode being provided on the opposite side of the semiconductor layer from the source and drain electrodes and remote from the substrate surface. Referring also to FIG. 2, which shows the TFT in plan view, with the cross-section of FIG. 1 being along the line I—I of FIG. 2, the TFT 10 comprises source and drain contacts 14 and 16 of ITO material spaced apart from one another by a predetermined distance on the substrate surface. The particular example of TFT illustrated in FIGS. 1 and 2 includes a further source contact 14', again of ITO, which is spaced from the drain contact 16 on the opposite side from the source contact 14 by a similar distance. The two source contacts 14 and 14' comprise parts of the same layer of ITO and are thus interconnected electrically. This type of source/drain arrangement in which the source contact comprises two source contact portions on either side of the drain is known for example from EP-B-0276340.

The source and drain electrodes 14, 14' and 16 are provided directly on a layer 20 of amorphous semiconductor alloy material having a high defect density and low electrical conductivity that is carried directly on the surface of the substrate 12 over the region thereof underlying the source and drain contacts and the region of the substrate surface extending between the electrodes. In this particular embodiment, the layer 20 comprises a silicon-rich, hydrogenated amorphous silicon nitride, a—SiNx:H, layer. Alternatively, a layer of silicon-rich hydrogenated amorphous silicon carbide, silicon oxide, or silicon oxynitride or a layer of hydrogenated, silicon rich amorphous silicon germanium could be used. Such non-stoichiometric silicon alloy materials are eminently suitable as they not only can provide the high defect density and low conductivity characteristics required but are also entirely compatible with the processing used to fabricate the TFT. The conductivity of the material of the layer 20 is selected to be comparable with that of the intrinsic semiconductor material of the layer 22, or at least not significantly larger, and its defect density preferably is selected to be between $10^{17}$ and $10^{19}$ per cc.

A semiconductor layer 22 comprising intrinsic, undoped, hydrogenated amorphous silicon is disposed directly over this structure so as to cover the source and drain electrodes and the surface of the layer 20 extending between the source and drain electrodes. The layer 22 serves to provide a channel region 23 for the TFT extending between each of the source electrodes 14 and 14' and the drain electrode 16. Overlying this semiconductor layer 22 there is a gate dielectric layer 24, for example of silicon nitride, and a gate electrode 25 of metal, such as aluminium or chromium, which extends over the region of the layer 22 between the source electrodes 14 and 14', and thus the channel region 23 in the layer 22, and which has integral connection extensions 26.

With this structure, it will be appreciated that while the region in the amorphous silicon layer 22 of the TFT between the source and drain electrodes that serves as the channel region 23 is protected to some extent from incident light in that the opaque metal gate electrode 25 acts as a light shield to prevent light directed in a generally downward direction in FIG. 1 from reaching the channel region 23 in the layer 22, this region of the layer 22 is still susceptible to light from other directions, and particularly from the opposite direction, i.e. light passing through the substrate 12 towards the channel region 23 in the layer 22, as no light shield is provided underneath the channel region. By virtue of the provision of the silicon-rich silicon alloy layer 20, however, the effects of any light incident on the layer 22 at the channel region are minimised. The amorphous silicon semiconductor material used for the layer 22 exhibits photosensitivity so that upon exposure to light holes and electrons are generated producing a photocurrent. In a TFT such a photoelectric current could flow between the source and drain electrodes when the TFT is supposedly in its off, high resistance, state thus resulting in a leakage current. This leads to a deterioration of the on/off ratio and unacceptable performance. In the TFT structure of FIGS. 1 and 2, the layer 20, due to its high defect density, serves to provide recombination centres at the back of the channel region 23 so that holes and electrons generated by light incident on that region are recombined, typically within a distance comparable with the thickness of the layer 22, and so the 'off' resistance is not decreased to any significant extent. The general operation of the TFT is not affected. The low conductivity of the layer 20 ensures that substantially no significant current flow between the source and drain electrodes occurs through this layer 20.

The material of the layer 20 desirably has a band gap which is similar to, or only slightly wider or narrower than that of the intrinsic amorphous silicon of the layer 22. As a consequence excess carriers generated in the layer 22 are then able to move relatively easily into the layer 20 where they can be recombined. Its band gap should be such though that it does not become too conductive. The aforementioned silicon rich silicon alloy materials are able to satisfy these requirements. In these materials, the defects provide the recombination centres and are in the form of silicon dangling bonds which occur naturally. The characteristics of the material are preferably tailored so that the defects are distributed around the centre of the band gap into which excess carriers can move. These materials do not exhibit electric fields which could reflect holes at the interface with the layer 22. Holes generated for example by incident light within the layer 22 are therefore able to move into the interfacial region of the layer 20 where they recombine.

The TFT 10 is fabricated by firstly depositing a silicon rich amorphous silicon nitride layer 20 completely over the surface of the substrate 12 using a PECVD process from silane and nitrogen to a uniform thickness of approximately 10 to 25 nm. The silane and nitrogen are admitted to the vacuum system at a temperature of approximately 250° C. or lower so as to produce an hydrogenated, silicon-rich amorphous silicon nitride, a—SiNx:H, layer. The proportions of nitrogen and silicon are selected such that the ratio of nitrogen to silicon in the resulting layer is less than 1.0 and preferably less than 0.5. If silicon rich amorphous silicon oxide, carbide, oxynitride or germanium alloys are used instead, a similar ratio is selected. The band gap of this material is approximately 2 eV which is slightly larger than the band gap of intrinsic amorphous silicon material used for the layer 22, around 1.8 eV. Regions of this layer 20 at areas where for example transparent pixel element electrodes are subsequently to be provided may be removed at this stage. Thereafter, a layer of ITO is deposited directly over the surface of this silicon-rich silicon nitride layer to a thickness of approximately 40 nm. The ITO layer is then patterned by known photolithographic and etching processes, using a single mask, so as to leave portions constituting the desired source and drain electrode areas, with integral connection extensions, overlying the silicon-rich silicon nitride layer 20. The gap between each source electrode 14 and 14' and the drain electrode 16, defining the length of the channel, is around 5 to 10 μm. A layer of intrinsic hydrogenated amorphous silicon (a—Si:H) is then deposited by a PECVD process over this structure to a thickness of around 20 to 50 nm, followed by a layer of silicon nitride and a layer of metal, such as aluminium, which layers are then patterned using a photolithographic and etching process to leave the gate electrode 25 of aluminium, together with integral extensions 26, the gate dielectric layer 24 and the intrinsic semiconductor layer 22 extending over the source and drain electrodes 14, 14' and 16 and the surface of the layer 20 in the intervening spaces to form the structure of FIG. 1. A protective covering film of nitride (not shown) may be deposited over this structure.

The TFT may be used in a variety of known large area electronic devices, such as image sensors, touch sensors or memory devices and the like of the kind which employ TFTs in order to avoid the above described problems caused by the photosensitive behaviour of the semiconductor layer should the TFTs be subjected to light during operation. The TFT is particularly beneficial in an active matrix display device as light plays a major role in the operation of the device. The plan view shown in FIG. 2 illustrates the use of the TFT in an active matrix liquid crystal display device and more especially shows a part of a typical picture element in an array of picture elements in such a display device. In this picture element the drain electrode 16 of the TFT is connected to, and formed integrally with, a picture element electrode 44 and the gate 25 and the source electrodes 14 and 14' are connected to respective row and column conductors 41 and 42 via which the picture element is addressed. Active matrix liquid crystal display devices using TFTs as switching devices for the picture elements are well known and it is not thought necessary to describe here in detail their general construction and operation. Typical examples are described in U.S. Pat. No. 5,130,829 and EP-B-0217406 to which reference is invited.

Figure 3:
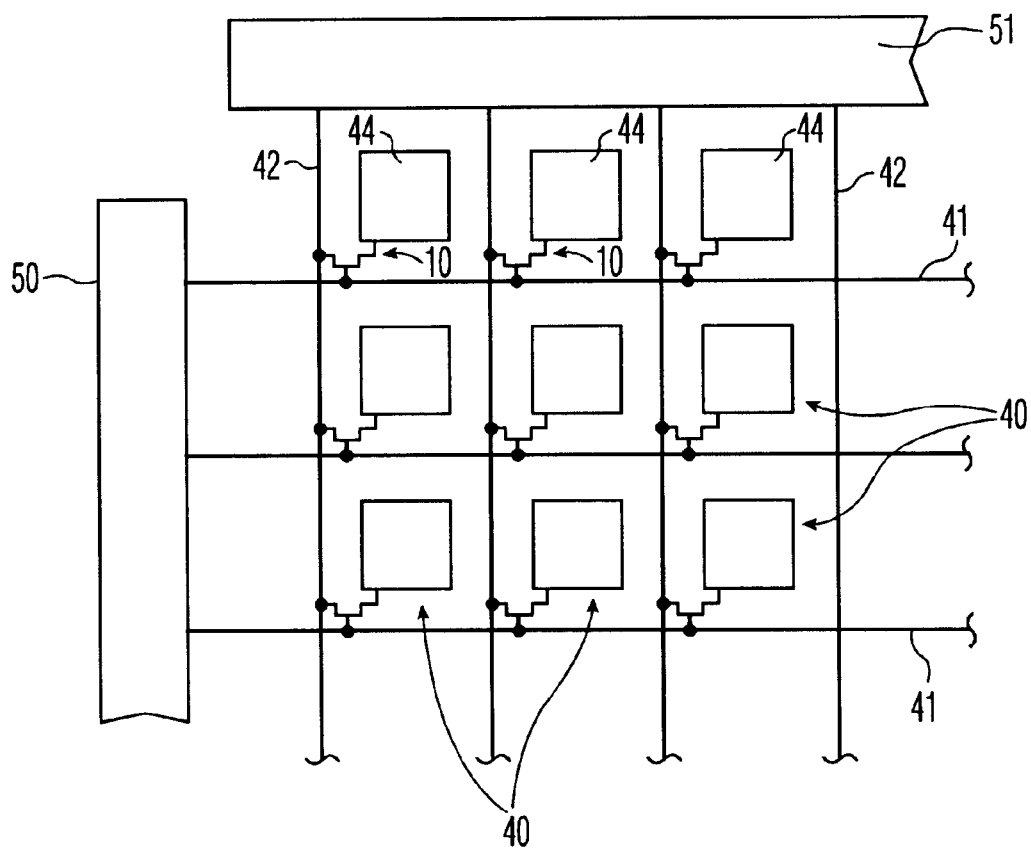
FIG. 3 is a circuit diagram of part of the display device.
Figure 4:
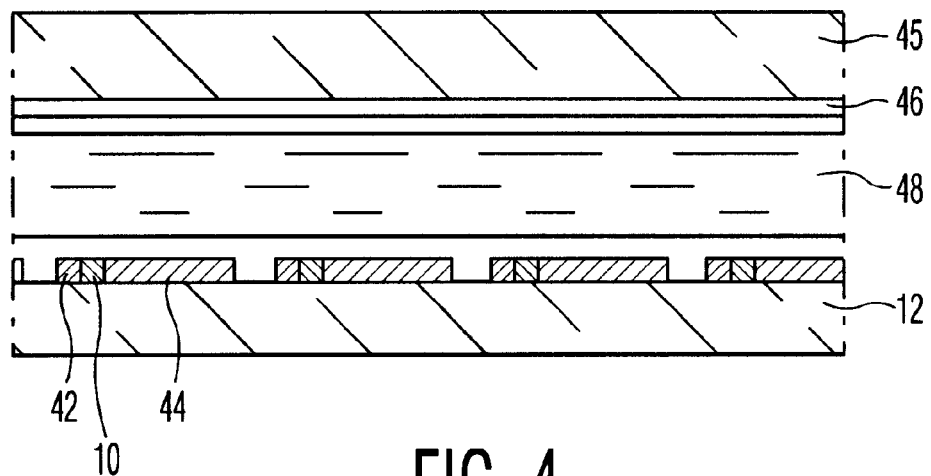
FIG. 4 is a cross-sectional view through part of the display device.
Figure 5:
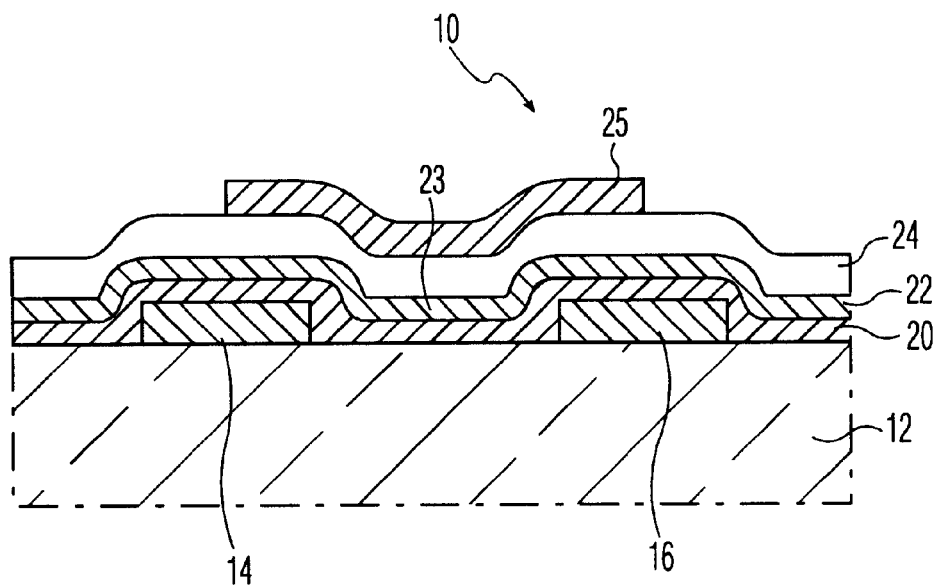
FIG. 5 is a cross-sectional view of an alternative form of top-gate TFT structure which may be used.
Figure 6:
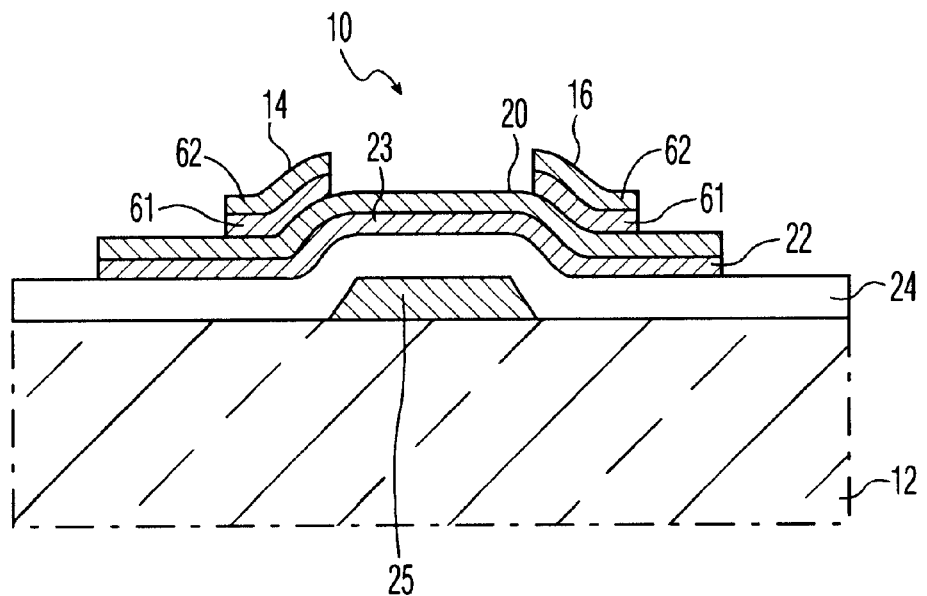
FIG. 6 is a cross-sectional view of a bottom-gate type TFT in accordance with the present invention which may be used instead.

Briefly, and referring to FIG. 3, a typical TFT type active matrix liquid crystal display device comprises a display panel having a row and column array of picture elements 40, each having an associated TFT 10 acting as a switching device. The picture elements are addressed via sets of row and column address conductors 41, 42. The drain of a TFT is connected to a respective picture element electrode 44 situated adjacent the intersection of respective row and column address conductors, while the gates of all the TFTs associated with a respective row of picture elements 40 are connected to the same row address conductor 41 and the sources of all the TFTs associated with a respective column of picture elements are connected to the same column address conductor 42. Referring also to FIG. 4, the sets of row and column address conductors 41, 42, the TFTs 10, and the picture element electrodes 44 are all carried on the same, transparent, substrate 12, usually of glass and fabricated simultaneously using common deposited layers. A second glass substrate, 45, carrying a continuous transparent electrode 46, common to all picture elements in the array is arranged spaced from the substrate 12 and the two substrates 12 and 45 are sealed together around their periphery and separated by spacers to define an enclosed space in which liquid crystal material 48 is contained. Each picture element electrode 44 together with an overlying portion of the common electrode 46 and the liquid crystal material 48 therebetween defines a light-modulating pixel element.

As will be apparent from FIG. 2, the picture element electrodes 44 are formed integrally with the drain electrodes 16 of the TFTs 10 by appropriate patterning of the deposited layer of ITO. The source electrodes comprising portions of respective column conductors 42 and extensions formed integrally with the column conductors are defined by this patterning. Thus, the column conductors 42, the source electrodes 14 and 14' and the electrodes 44 are all formed from a common layer of ITO using a single mask to define the required patterning. The TFT gate electrodes 25, and their extensions 26, comprise portions of respective row conductors 41.

In operation, scanning (gating) signals are applied to each row address conductor 41 in turn by a row driver circuit 50 (FIG. 3) and data signals are applied to the column conductors 42 in synchronisation with the gating signals by a column driver circuit 51 and upon each row conductor being supplied with a gating signal, the TFTs 10 connected to that row conductor are turned on causing the respective picture elements to be charged according to the level of the data signal then existing on their associated column conductors. Upon termination of a gating signal, the TFTs of a row switch to their off, high resistance, state and a gating signal is applied to the next row conductor in order to address the next row of picture elements. In a transmissive mode of operation, the individual liquid crystal picture elements serve to modulate light which may be directed onto the substrate 12 from a backlight, as signified by the arrow in FIG. 4, so that a display image, built up by addressing all the picture elements in the array, can be viewed from the other side of the panel. After a row of picture elements has been addressed the TFTs 10 associated with that row are turned off for the remainder of the field period and until that row is next addressed in a subsequent field period in order to electrically isolate the picture elements and ensure that the applied charge is stored, and the picture element outputs maintained, until they are again addressed. Photocurrents generated in the channel regions of the TFTs due to light incident thereon from the backlight could lead to leakage currents occurring between the source and drain electrodes in the TFTs, and thus a decrease in the "off" resistance of the TFTs when supposedly in their "off" state, causing the charge stored in the picture elements to change and thus degradation of the display quality. However, the presence of the layer 20 at the back of the channel regions of the TFTs results in the recombination of the holes and electrons generated in the channel region by incident light and consequently an avoidance, or at least a significant reduction, of the leakage photocurrents between the source and drain electrodes so that display quality is maintained.

Various modifications to the above-described arrangement are envisaged. The layer 20 may be patterned prior to the deposition of the ITO to form islands present at the regions where the TFTs are to be formed and particularly the area underlying the eventual channel region of the semiconductor layer. The material of the layer 20 is preferably not present beneath the picture element electrodes 44 as it may not be sufficiently transparent to light. The layer 20 may simply be patterned prior to depositing the ITO so as to remove portions of the layer at the regions of the eventual picture element electrodes 44 which you would improve overall transparency of the panel. Alternatively, to enable the material of the layer 20 to be removed readily at the regions of the picture element electrodes when patterning the layers 24 and 25, these electrodes may be formed separately from the drain electrodes of the TFTs and deposited subsequently so as to contact the drain electrodes. In the case though of a display panel operable in a reflective mode in which the picture element electrodes are formed of reflective material, for example a metal such as chromium, and transparency in the underlying structure is not required such removal of selected portions would not be necessary.

The structure of the TFTs may be varied. Of course, the TFTs need not have two source electrodes as in the above-described arrangement but could be of the more conventional form having a single source electrode spaced from a drain electrode between which a channel region is formed. Moreover, the TFTs 10 could for example be of the top-gate coplanar type in which the source and drain electrodes are disposed on the same side of the intrinsic amorphous silicon semiconductor layer 22 as the gate electrode 25, i.e. the side remote from the substrate 12. To this end, the intrinsic semiconductor layer is deposited directly over the silicon rich silicon nitride layer 20 and patterned prior to the deposition of the ITO film. After patterning the ITO film to define the source and drain electrodes and the column conductors 42, the gate dielectric and gate electrode layers are formed as before. It will be appreciated that with this structure, the layer 20 lies directly underneath the region of the intrinsic semiconductor layer 22 forming the TFT channel as before.

The source and/or drain electrodes of the TFT, and the column conductors 42 may be formed of a metal rather than ITO.

Ohmic contact layers of doped, n+, amorphous silicon may be provided directly over the source and drain electrodes in known manner, and the intrinsic semiconductor layer arranged to extend over these doped layers.

The layer 20 need not extend beneath the source and drain electrodes 14, 14' and 16 but could instead be deposited after forming the source and drain electrodes and prior to the deposition of the intrinsic amorphous silicon semiconductor layer 22 so that it extends over the source and drain electrodes as well as over the surface of the substrate between the source and drain electrodes. Such a TFT construction is shown schematically in cross-section in FIG. 5, the TFT 10 in this case being of a more conventional type having just one source electrode 14. The presence of the layer 20 between the source and drain electrodes 14 and 16 and the immediately overlying regions of the intrinsic semiconductor layer 22 should not affect unduly the TFT's operation if the material used for the layer 20 is selected suitably.

While the invention is particularly useful in top gate TFT structures, it is envisaged that it can be used to advantage also in bottom gate TFTs. An example of a bottom gate TFT using the invention is shown schematically in cross-section in FIG. 6. Again, like reference numerals denote similar parts, and as can be seen, the gate electrode 25 is in this case provided on the same side of the semiconductor layer 22 as the substrate 12 and the source and drain electrodes 14 and 16 are provided at the side of the layer 22 remote from the substrate. The gate electrode 25 is formed directly on the substrate surface and the gate insulator layer 24 extends over this electrode. The intrinsic semiconductor layer 22 extends over the layer 24 and provides a channel region 23 between the source and drain electrodes 14 and 16 overlying the gate electrode 25. As in the TFT of FIG. 5, the layer 20 extends immediately adjacent the semiconductor layer 22, but this time at its side remote from the substrate 12, and between the source and drain electrodes 14 and 16 and respective immediately underlying regions of the layer 22. In this particular example, the source and drain electrodes 14 and 16 each comprise doped (n+) amorphous silicon sub-layers, 61, and an overlying metal layer, 62, for example of aluminium and/or chromium.

From reading the present disclosure, other modifications will be apparent to persons skilled in the art. Such modifications may involve other features which are already known in the field of TFTs and large area electronic devices such as active matrix display devices and component parts thereof and which may be used instead of or in addition to features already described herein.

What is claimed is:

1. An electronic device comprising a thin film transistor carried on a transparent, insulating, substrate, and having spaced source and drain electrodes, an intrinsic amorphous silicon semiconductor layer extending between the source and drain electrodes for providing a channel region between the source and drain electrodes, and a gate insulator layer and gate electrode extending adjacent to the intrinsic semiconductor layer, characterised in that the channel region of the intrinsic semiconductor layer at its side remote from the gate electrode extends directly adjacent to a layer of amorphous semiconductor material having a high defect density and low conductivity and which serves to provide recombination centres for photogenerated carriers.

2. An electronic device according to claim 1, characterised in that said layer of amorphous semiconductor material having a high defect density comprises a silicon rich amorphous silicon alloy material.

3. An electronic device according to claim 2, characterised in that said silicon rich material comprises silicon nitride material.

4. An electronic device according to claim 2, characterised in that said silicon rich material comprises silicon carbide material.

5. An electronic device according to claim 2, characterised in that said silicon rich material comprises silicon oxide material.

6. An electronic device according to claim 2, characterised in that said silicon rich material comprises silicon oxynitride material.

7. An electronic device according to claim 2, characterised in that said silicon rich material comprises amorphous silicon germanium.

8. An electronic device according to claim 1, characterised in that the TFT comprises a top gate TFT in which the gate electrode is provided at the side of the intrinsic semiconductor layer remote from the substrate.

9. An electronic device according to claim 8, characterised in that the source and drain electrodes are situated at the opposite side of the intrinsic semiconductor layer from the gate electrode.

10. An electronic device according to claim 1, characterised in that device comprises a plurality of said TFTs carried on said substrate.

11. An electronic device according to claim 10, characterised in that the electronic device comprises an active matrix liquid crystal display device having an array of picture elements addressed by sets of address conductors carried on the substrate, each picture element comprising a said TFT whose source and gate electrodes are connected to respective address conductors and whose drain is connected to a picture element electrode.

\* \* \* \* \*